(12) United States Patent
Dubois et al.

(10) Patent No.: US 8,216,896 B2
(45) Date of Patent: Jul. 10, 2012

(54) METHOD OF FORMING STI REGIONS IN ELECTRONIC DEVICES

(75) Inventors: Jerome Dubois, Nijmegen (NL); Johan D. Boter, Nijmegen (NL)

(73) Assignee: NXP B.V., Eindhoven (NL)

( * ) Notice: Subject to any disclaimer, the term of this patent is extended or adjusted under 35 U.S.C. 154(b) by 11 days.

(21) Appl. No.: 11/816,163

(22) PCT Filed: Feb. 1, 2006

(86) PCT No.: PCT/IB2006/050343
§ 371 (c)(1),
(2), (4) Date: Aug. 14, 2008

(87) PCT Pub. No.: WO2006/085245
PCT Pub. Date: Aug. 17, 2006

(65) Prior Publication Data
US 2009/0053874 A1 Feb. 26, 2009

(30) Foreign Application Priority Data
Feb. 11, 2005 (EP) .................... 05101017

(51) Int. Cl.
*H01L 21/8238* (2006.01)
(52) U.S. Cl. ................ 438/224; 438/433; 257/E21.551
(58) Field of Classification Search .................. 438/218, 438/221, 224, 228, 294, 296, 298, 359, 424, 438/433, 289; 257/E21.545, E21.546, E21.551
See application file for complete search history.

(56) References Cited

U.S. PATENT DOCUMENTS

| | | | |
|---|---|---|---|
| 5,837,612 A * | 11/1998 | Ajuria et al. | 438/697 |
| 6,080,628 A * | 6/2000 | Cherng | 438/296 |
| 6,096,612 A * | 8/2000 | Houston | 438/296 |
| 6,097,072 A * | 8/2000 | Omid-Zohoor | 257/397 |
| 6,143,624 A | 11/2000 | Kepler et al. | |
| 6,225,188 B1 | 5/2001 | Wristers et al. | |
| 6,562,697 B1 * | 5/2003 | Cho et al. | 438/424 |
| 6,566,230 B1 * | 5/2003 | Sachar et al. | 438/435 |
| 6,599,810 B1 * | 7/2003 | Kepler et al. | 438/424 |
| 6,624,016 B2 * | 9/2003 | Wu | 438/221 |
| 6,768,148 B1 | 7/2004 | Cho et al. | |
| 7,045,436 B2 * | 5/2006 | Chatterjee et al. | 438/433 |
| 7,135,379 B2 * | 11/2006 | Orlowski et al. | 438/426 |
| 2002/0031890 A1 | 3/2002 | Watanabe et al. | |
| 2002/0045324 A1 * | 4/2002 | Ding | 438/424 |
| 2002/0142552 A1 * | 10/2002 | Wu | 438/301 |
| 2002/0179997 A1 | 12/2002 | Goth et al. | |
| 2003/0098491 A1 | 5/2003 | Tsutsumi | |
| 2004/0087094 A1 * | 5/2004 | Wristers et al. | 438/302 |
| 2004/0142521 A1 | 7/2004 | Park | |
| 2004/0142538 A1 * | 7/2004 | Takahashi | 438/424 |
| 2004/0142545 A1 * | 7/2004 | Ngo et al. | 438/585 |
| 2005/0056885 A1 * | 3/2005 | Pai et al. | 257/330 |
| 2005/0158964 A1 * | 7/2005 | Chiu et al. | 438/424 |
| 2005/0208724 A1 | 9/2005 | Cao et al. | |
| 2006/0148157 A1 * | 7/2006 | Tao et al. | 438/199 |

* cited by examiner

*Primary Examiner* — William D Coleman
*Assistant Examiner* — Su Kim

(57) ABSTRACT

The invention relates to a method of manufacturing integrated circuits and in particular to the step of forming shallow trench isolation (STI) zones. The method according to the present invention leads to electronic devices and to integrated circuits having reduced narrow width effect and edge leakage. This is achieved by performing an extra implantation step near the edge of the STI zone, after formation of the STI zones.

16 Claims, 4 Drawing Sheets

METHOD OF FORMING STI REGIONS IN ELECTRONIC DEVICES

Figure 1:
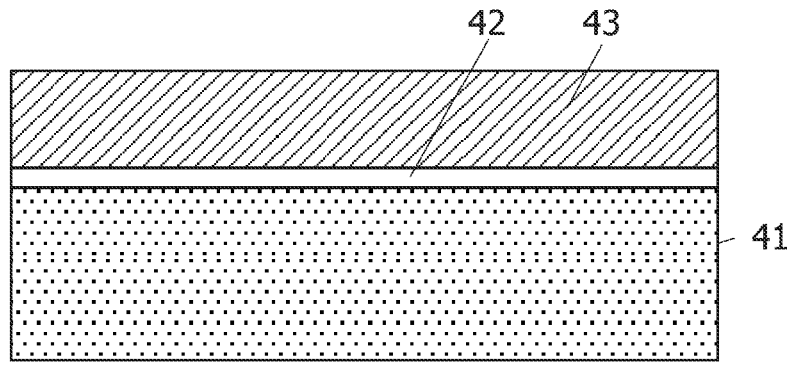

The present invention relates to semiconductor processing, especially integrated circuit (IC) manufacturing, and more particularly to the step of forming shallow trench isolation (STI) regions. The method of the invention leads to semiconductor devices showing an improved parasitic edge current leakage and narrow width effect.

In CMOS processing, shallow trench isolation (STI) regions are formed to provide electrical isolation between different devices on a semiconductor substrate. An advantage of this type of isolation is the high packing density that can be achieved. However, a disadvantage of STI is edge leakage of transistors, which can be caused by oxide thinning, two-dimensional effects of the control of the gate on the channel area and loss of dopant in this edge region. Furthermore, the edge leakage results in a large reduction of the threshold voltage $V_t$ of the semiconductor devices when the width of these semiconductor devices is scaled down.

Several ways exist for improving the edge leakage and the associated narrow width effect. Examples hereof are an increase of the oxide thickness at the edges or an implantation of the sidewalls of the STI trench. The first option usually leads to a reduction of the packing density whereas the latter option has the disadvantage that the implanted dopants diffuse over a large area during the usually high temperature steps of the STI gap-fill.

U.S. Pat. No. 6,562,697 describes a method for the formation of active areas in integrated circuits. An etch-stop layer is formed on top of a substrate, and recesses are formed through the etch-stop layer into the substrate. The method described includes an etchback of the etch-stop layer. Thereafter, implantations are performed to form active areas, using this etched-back etch-stop layer as an implantation mask.

A disadvantage of the method described in U.S. Pat. No. 6,562,697 is that, by doing an etch back of the etch stop layer, not only the side of this layer is etched, but also the thickness of this layer is reduced. This induces additional variation of the thickness of the etch stop layer, which may have a negative impact on the total isolation structure. The wet etch is always an interaction between the amount of etch stop layer that should be etched away from the side and the remaining thickness of the layer. A too thin nitride layer might, besides the negative impact it may have on the isolation structure, also not be a good blocking layer for the additional implant at the edge of the isolation structure.

The method described furthermore shows the disadvantage that etching back of the etch-stop layer implies that the etch back distance is very difficult to control, and thus also the ultimate location of the implanted areas is difficult to control. Furthermore, the dimensions obtained depend on the etch rate and the duration of the etch. This may lead to large variations in the thickness of the etch stop layer at different positions on a wafer due to etch rate variations within the wafer.

It is an object of the present invention to provide a method for the formation of isolation zones in electronic devices, as well as the devices produced. This method generates devices with improved characteristics.

The above objective is accomplished by a method according to the present invention.

An advantage of a method of the present invention is that it can produce devices showing improved narrow width effect and edge leakage.

Particular and preferred aspects of the invention are set out in the accompanying independent and dependent claims. Features of the dependent claims may be combined with features of the independent claims and with features of other dependent claims as appropriate and not merely as explicitly set out in the claims.

The present invention provides a method of forming isolation zones in the manufacturing process of an electronic device. The method comprises:

forming a patterned mask layer and a first layer on top of a substrate, the patterned mask layer having side walls, forming spacers at the side walls of the patterned mask layer, forming trenches in the substrate, using the patterned mask layer and the spacers as a mask, forming shallow trench isolation zones by filling the trenches, performing a first implant of ions, using at least the patterned mask layer as a mask, and removing the patterned mask layer.

The method may further comprise, before performing a first implant of ions, at least partially, i.e. partially or completely, removing said spacers. The amount of spacer material that is removed is one of the parameters controlling, for certain implantation parameters, how much implantation ions will reach the substrate, and where they will reach the substrate. In one embodiment of the present invention, the spacers may be completely removed before a first implantation of ions is performed.

Semiconductor devices, such as integrated circuits, formed by means of the method according to the present invention show suppressed narrow width effect and edge current leakage, without the large width effect being affected. Furthermore, the method according to the present invention has a better control of the critical dimension (CD) of the area in which the additional implantation at the edges is carried out. The use of spacers enables a much better controlled area to be achieved than when an etchback masking layer is used, as is the case in the methods known in the prior art. As technology feature sizes are scaled down more and more, this becomes more important.

The spacers may be formed by depositing a first layer and etching back said layer to form the spacers. The first layer may be, for example, a TEOS (Tetraethyl orthosilicate) or a HTO (high temperature oxidation) oxide. What is important is that the material used to form the first layer can be etched selectively with respect to the patterned mask layer and the substrate. Partially removing the spacers may be performed by an etching process.

In one embodiment according to the invention, the substrate lying in a plane, a first implant of ions may be performed in a direction substantially perpendicular to the direction of the plane of the substrate. In another embodiment, the first implant of ions may be performed in a direction making an angle $\alpha$ with the direction substantially perpendicular to the plane of the substrate. The angle $\alpha$ may typically be between 0 and 45°. If the spacers are not removed before implantation, the implantation needs to be performed at a non-zero angle with respect to the direction substantially perpendicular to the plane of the substrate. The first implantation of ions may be performed by implanting ions with a dose of between 1e12 and 1e14 $cm^{-3}$ and an energy of between 10 and 50 keV.

According to the invention, the method may furthermore comprise a second implant step.

These and other characteristics, features and advantages of the present invention will become apparent from the following detailed description, taken in conjunction with the accompanying drawings, which illustrate, by way of example, the principles of the invention. This description is given by way of example only, without limiting the scope of the invention. The Figures quoted below refer to the attached drawings.

FIG. 1 to FIG. 11 illustrate sequential steps in the processing of isolation structures in integrated circuits according to an embodiment of a method of the present invention.

In the different Figures, the same reference signs refer to the same or analogous elements.

The present invention will be described with respect to particular embodiments and with reference to certain drawings, but the invention is not limited thereto, as it is limited only by the appended claims. Any reference signs in the claims shall not be construed as limiting the scope of the claims. The drawings described are only schematic and are non-limiting. In the drawings, the size of some of the elements may be exaggerated and not drawn to scale for illustrative purposes. Where the term "comprising" is used in the present description and claims, it does not exclude other elements or steps. Where an indefinite or definite article is used when referring to a singular noun e.g. "a" or "an", "the", this includes the plural of that noun unless specifically stated otherwise.

Furthermore, the terms first, second, third and the like, as used in the description and in the claims, are used for distinguishing between similar elements and not necessarily for describing a sequential or chronological order. It is to be understood that the terms so used are interchangeable under appropriate circumstances and that the embodiments of the invention described herein are capable of operation in sequences other than those described or illustrated herein.

Moreover, the terms top, bottom, over, under and the like, as used in the description and the claims, are used for descriptive purposes and not necessarily for describing relative positions. It is to be understood that the terms so used are interchangeable under appropriate circumstances and that the embodiments of the invention described herein are capable of operation in orientations other than those described or illustrated herein.

The present invention provides a method for the formation of isolation zones in electronic devices, such as integrated circuits. In the following description, the sequential steps of the method according to the present invention will be discussed.

Referring to FIG. 1, in a first step, a substrate 41 is provided. In embodiments of the present invention, the term "substrate" may include any underlying material or materials that may be used, or upon which a device, a circuit or an epitaxial layer may be formed. In other alternative embodiments, this "substrate" may include a semiconductor substrate such as, e.g., a doped silicon, a gallium arsenide (GaAs), a gallium arsenide phosphide (GaAsP), an indium phosphide (InP), a germanium (Ge), or a silicon germanium (SiGe) substrate. The "substrate" may include, for example, an insulating layer, such as a $SiO_2$ or an $Si_3N_4$ layer, in addition to a semiconductor substrate portion. Thus, the term substrate also includes silicon-on-glass, silicon-on-sapphire substrates. The term "substrate" is thus used to define generally the elements for layers that underlie a layer or portions of interest. Also, the "substrate" may be any other base on which a layer is formed, for example a glass or metal layer.

On top of the substrate 41 a first insulating layer, such as an oxide layer 42, is grown. This may preferably be done by thermal oxidation. However, other suitable ways to form an oxide layer may also be applied according to the invention. The first oxide layer 42 may typically have a thickness in the range between 5 and 15 nm. On top of the first oxide layer 42, a mask layer 43 is deposited. The mask layer 43 may preferably comprise a nitride, but in other embodiments it may comprise other suitable materials provided that their properties are such that they act as a stop layer for a polishing step, such as CMP (chemical mechanical polishing), that they are resistant to etching of third insulating layer 48, e.g. wet oxide etching, and that they are resistant to etching of the anisotropic substrate, e.g. dry Si etching, that creates the trenches (see further below).

In the further description, however, the mask layer 43 will be referred to as the nitride layer 43. It has to be understood that this is only for ease of explanation and is not intended to be limiting. The nitride layer 43 may have a thickness of between 100 and 200 nm. The substrate 41 supporting the first oxide layer 42 and the nitride layer 43 is illustrated in FIG. 1.

Figure 2:
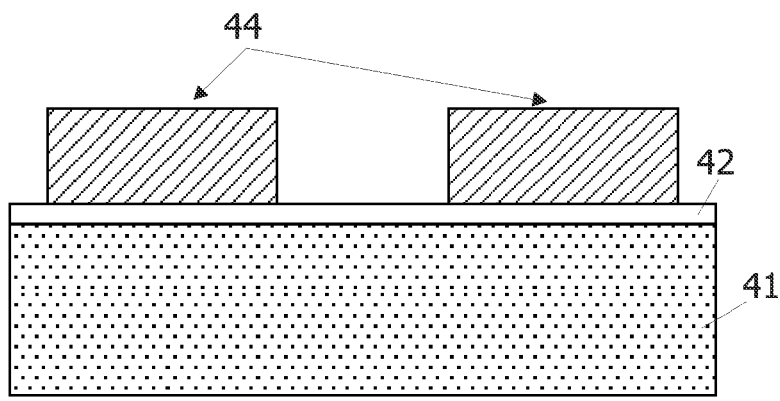

In a next step, the nitride layer 43 is etched to form a patterned nitride layer 44 (FIG. 2). This may be done by, for example, photolithography, which is known to a person skilled in the art. The photolithography process comprises, for example, the following sequential steps. First, a photoresist layer is applied, e.g. by means of spincoating, on top of the nitride layer 43 which is on top of the oxide layer 42 on the substrate 41. The photoresist layer may have, for example, a thickness of a few μm and may be made of any suitable polymer that can be used as a photoresist, such as for example poly(vinyl cinnamate) or novolak-based polymers. Thereafter, a mask is applied to align a pattern on the substrate 41. The photoresist layer is then illuminated through the mask, e.g. by means of UV light. After illumination, the photoresist is developed, causing either the illuminated parts of the photoresist (positive resist) or the non-illuminated parts of the photoresist (negative resist) to be removed, depending on which type of photoresist has been used. Patterning of the nitride layer 43 is then performed using, the developed photoresist layer as a mask, after which the remaining parts of the photoresist layer are removed, typically, by using an organic solvent. The result is shown in FIG. 2.

Figure 3:
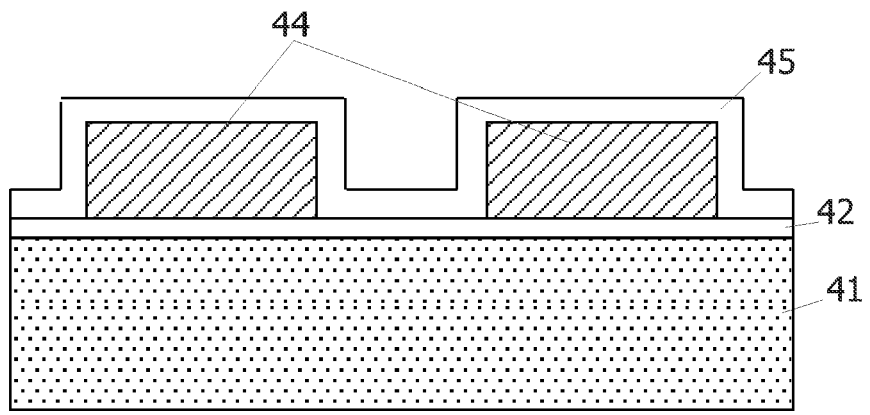
Figure 4:
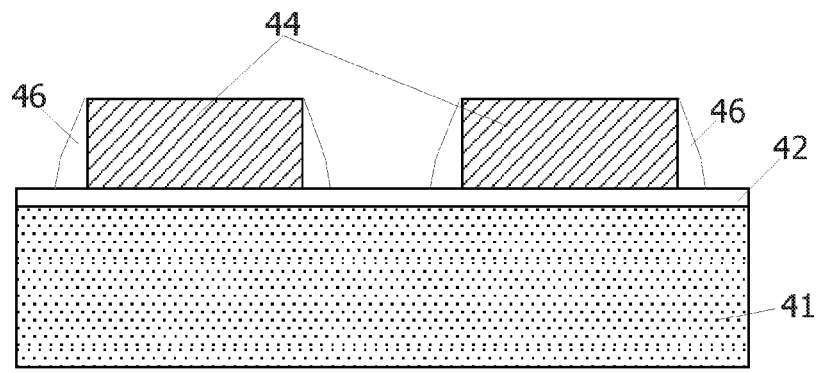

On top of the patterned nitride layer 44 a second insulating layer 45 is deposited (see FIG. 3). The second insulating layer 45 may be, for example, an oxide layer 45, such as for example, a TEOS or a HTO oxide layer. What is important is that the material from which the second layer 45 is formed can be etched selectively with respect to the patterned nitride layer 44 and the substrate 41. In the further description, the second layer 45 will be referred to as the second oxide layer 45. This, however, does not limit the invention, as it is used only for ease of explanation. The second oxide layer 45 may have a thickness of between 20 and 80 nm. In a subsequent step, the second oxide layer 45 is anisotropically etched back to form oxide spacers 46 (see FIG. 4). The dimensions of the oxide spacers 46 will be determined by the thickness of the second oxide layer 45 out of which the oxide spacers 46 are formed. The spacer etch can be controlled well by using, for example, endpoint detection. In that way, variations in etch rate may be compensated for. In contrast to the methods of the present invention, the dimensions obtained with a wet etch, as is the case in the known prior art methods, depend on the etch rate and the duration of the etch. This will lead to larger variations due to etch rate variations within a wafer or etch rate differences due to pattern density differences.

Figure 5:
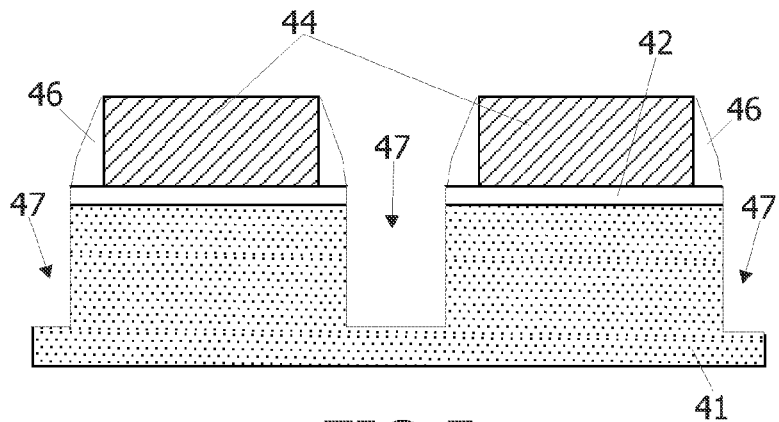

Next, trenches 47 are etched in the substrate 41 at positions which are not covered by the patterned nitride layer 44 or by the spacers 46, e.g. oxide spacers in this example. The etching process may be any suitable etching process which is selective towards the material from which the spacers 46 are formed, e.g. oxide, and to the material the mask layer 43 is formed of, i.e. nitride in this example. This step is illustrated in FIG. 5.

Figure 6:
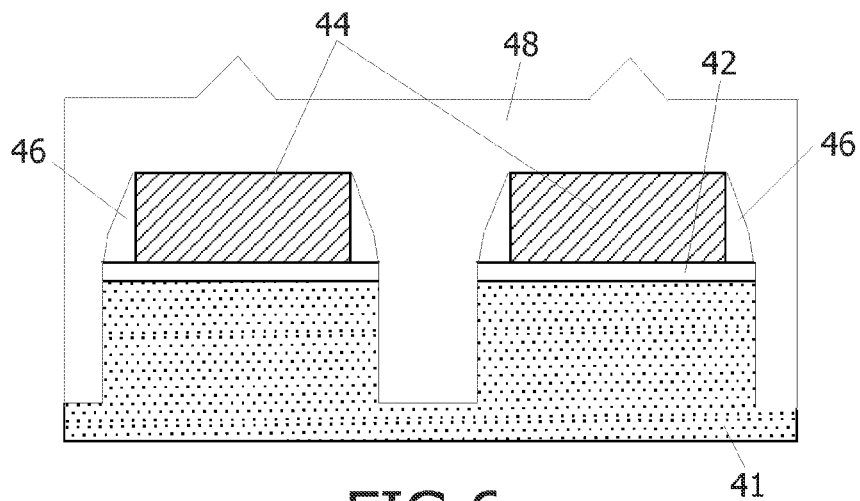
Figure 7:
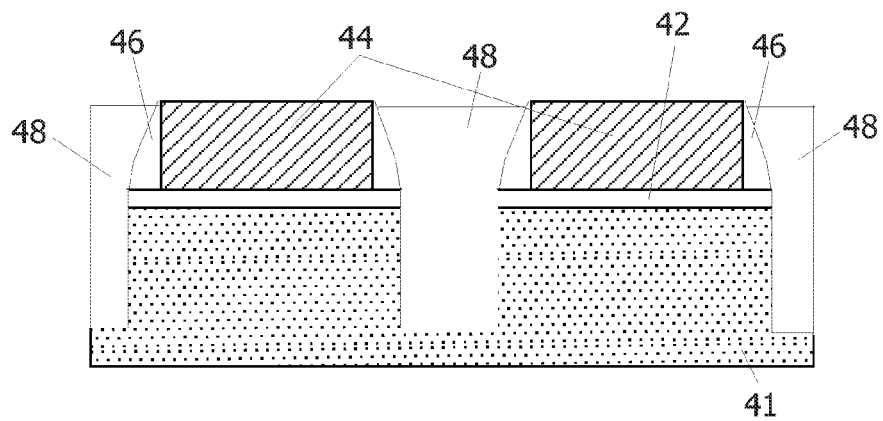

In a next step, the trenches 47 in the substrate 41 are filled with a third insulating layer 48. This may preferably be done using a liner oxidation, followed by an oxide fill. The oxide fill is performed by depositing a third oxide layer 48, which has a thickness such that it covers the whole structure obtained up till now in the process. This is illustrated in FIG. 6. The peaks on top of the third oxide layer 48 are typical of HDP (high-density plasma) oxides, due to the combination of deposition and sputtering during the HDP oxide deposition. If, however, other methods are used for depositing the third oxide layer 48, the top of the surface of the third oxide layer 48 may have a different shape. The third oxide layer 48 should have a good gap-fill capability. After this, usually a high temperature densification is carried out. Liner oxidation and densification may be performed at temperatures between 1000 and 1200° C. Then, the third oxide layer 48 is planarized. This may be done by, for example, a polishing process, such as chemical-mechanical polishing (CMP), known to a person skilled in the art. The structure after planarization is illustrated in FIG. 7. Because there is a certain selectivity of the CMP process between oxide and nitride, the level of the third oxide layer 48 and the level of the patterned nitride layer 44 after polishing may be a little different, as can be seen from FIG. 7.

Figure 8:
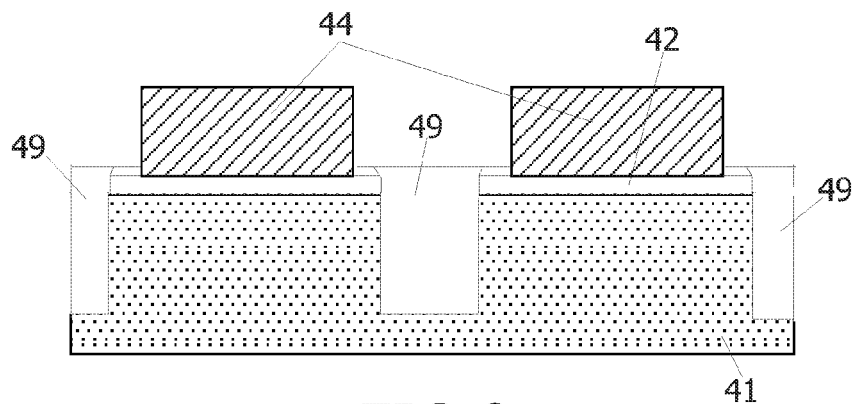

In a further step, which is optional, a wet oxide etch is performed. In that way, the oxide spacers 46 are at least partially, i.e. partially or completely, removed and the third oxide layer 48 is partly removed, as illustrated in FIG. 8, thereby forming shallow trench isolation (STI) zones 49.

Figure 9:
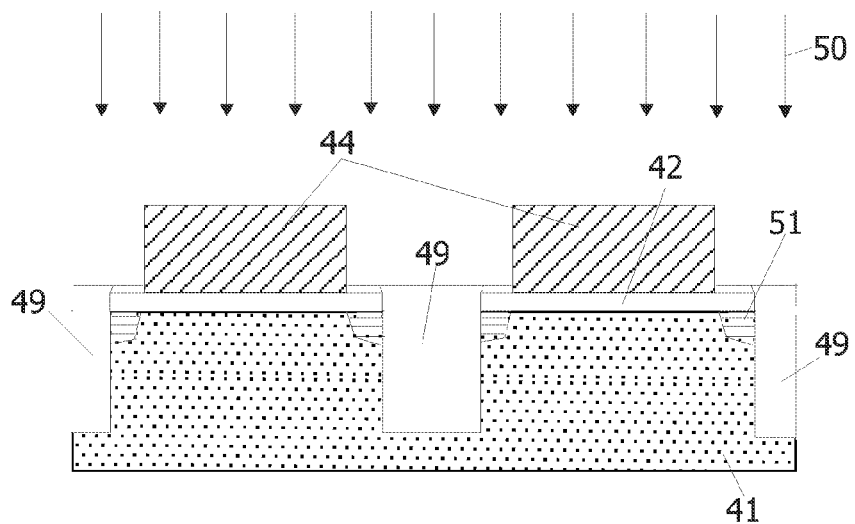

Next, a first implantation step, which is illustrated in FIG. 9, is performed. The first implant of ions is performed using at least the patterned nitride layer 44 as a mask. This means that ions are implanted only in those parts of the substrate 41 which are not covered by the patterned nitride layer 44, nor by other ion blocking layers, leading to the formation of implanted regions 51. The energy of the implant is tuned to avoid that the implanted species penetrate through the nitride, which is typically between 100 and 200 nm thick, into the channel region. However, the energy should be high enough to enable the implanted species to penetrate through the insulating material, e.g. oxide layer, if present on top of the substrate 41. The thickness of the insulating material still present where implanted regions 51 are to be provided may range between, for example, 0 and 60 nm. Furthermore, the amount of spacer material that has been optionally removed during the previous step is also one of the parameters determining the amount and the location of material, i.e. ions, implanted into the substrate. A typical energy range which may be used according to the invention is between 10 and 50 keV. Typical doses of ions to be implanted ranging between 1e12 and 1e14 $cm^{-3}$ may be used according to the method of the invention.

Figure 10:
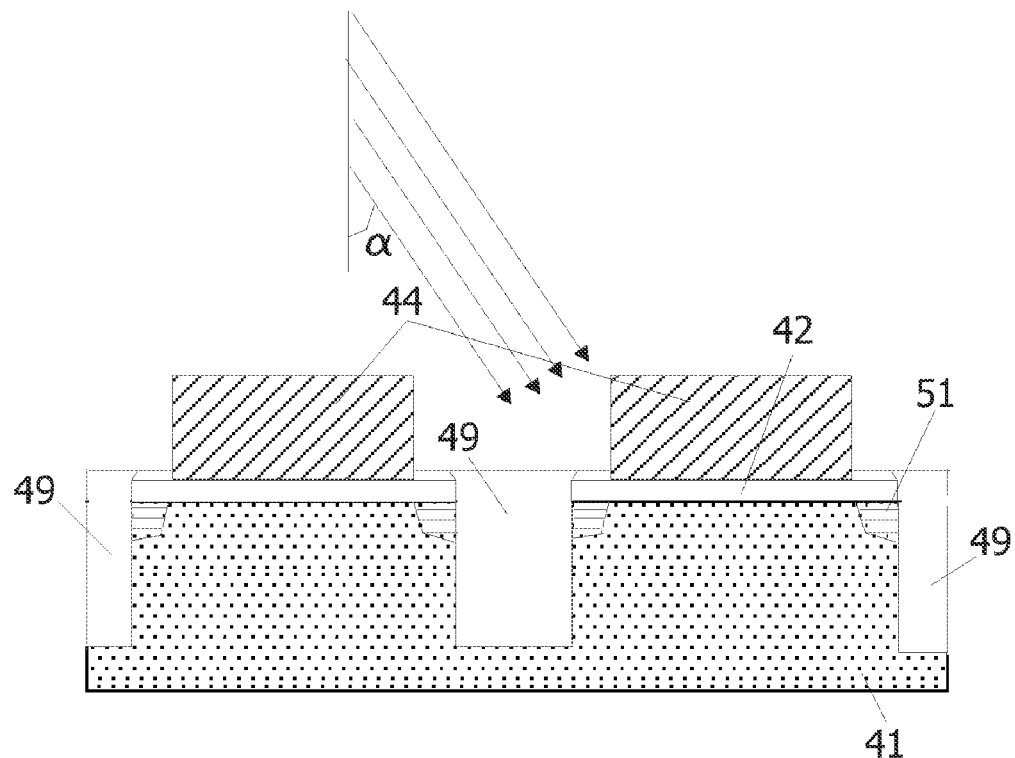

In the example given in FIG. 9, implantation of ions is performed in a direction substantially perpendicular to the plane of the substrate 41, as indicated by means of arrows 50. In other embodiments according to this invention, however, tilted implantation may also be performed, i.e. the implantation direction may make an angle $\alpha$ with a direction substantially perpendicular to the plane of the substrate 41, as indicated in FIG. 10. Typical values for the angle $\alpha$ may be between 0 and 45°. By using this tilted implantation the extension of the implanted regions 51 may even be more precisely controlled. This can be considered to be a fine tuning measure. If required, the implant step may be repeated with different masks, different angles, different implant energies and implant species, to optimize different types of devices on a same wafer.

Figure 11:
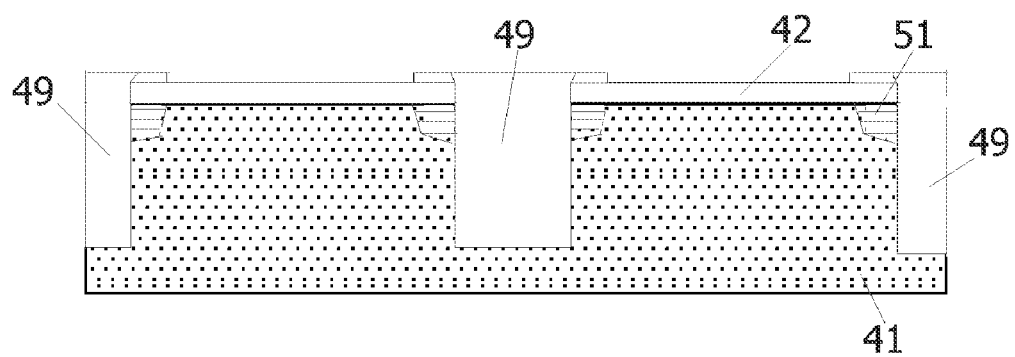

In a next step, the patterned nitride layer 44 is removed, e.g. with a wet etch. For this step, any suitable wet etch process known to persons skilled in the art may be used, provided that it is selective towards oxide and thus does not etch the oxide layer 42 and the oxide 49 the trenches 47 are filled with. FIG. 11 illustrates the substrate 41 with the resulting shallow trench isolation (STI) zones 49 as formed by the method according to the present invention, the STI zones 49 comprising additional implanted regions 51 at their edges.

In a further step, a second implant operation may be performed into the implanted regions 51 and into the areas that were shielded from the first ion implantation. Basically, this step is always required for determining the threshold voltage. Usually this second implantation step comprises multiple implants with a dose ranging typically between 1e11 and 5e13 $cm^{-3}$, and with energies ranging from 10 keV up to 1.5 MeV. Implant angles may typically be between 0 and 10 degrees.

After this step, the patterned mask 44 is removed, as illustrated in FIG. 11. The final thickness of the insulating layer 42, 49, e.g. oxide layer, especially at the interface where the mask 44 is removed, may change depending on how far the spacer 46 was etched back, i.e. either to a level above that of layer 42, i.e. the spacer is partially removed, or to a level below that of layer 42, i.e. the spacer 46 is completely removed; or even the insulating layer underneath the spacer 46 may be at least partially removed.

After formation of the STI zones 49 with additional implanted regions 51 at their edges, further processing of the integrated circuit may be performed as known to a person skilled in the art, i.e. electronic devices, such as e.g. transistors, may be formed on top of the structure as shown in FIG. 11.

As, according to the method of the present invention, implantation of ions is performed after the formation of the STI zones 49, and, thus, after the process steps which require a high temperature, the additional implant may be performed with the same thermal budget as the standard well implants known to a person skilled in the art, thereby avoiding too much diffusion.

Semiconductor devices, such as integrated circuits, formed according to the present invention show suppressed narrow width effect and edge current leakage, without the large width being affected. Suppression of the leakage current for narrow width devices by one or two orders is achievable depending on the dose of implanted ions. The narrow width reduction can be suppressed completely, also depending on the dose of the implanted ions. Furthermore, compared to the prior art methods, the method according to the present invention has a better control of the CD of the area in which the additional implantation at the edges is carried out. By using spacers 46, a much better controlled area may be achieved than when an etchback masking layer is used, as is the case in U.S. Pat. No. 6,562,697. As technology feature sizes are scaled down more and more, this becomes more important. The dimensions of the spacers 46 may be controlled by the thickness of the second oxide layer 45, whereas etching of the spacers 46 can be performed using end-point detection.

It is to be understood that although preferred embodiments, specific constructions and configurations, as well as materials, have been discussed herein for devices according to the present invention, various changes or modifications in form and detail may be made without departing from the scope and spirit of this invention.

The invention claimed is:

1. A method of forming isolation zones in the manufacturing process of an electronic device, the method comprising:

forming a patterned mask layer and a first layer on top of a substrate, said patterned mask layer having side walls;

forming spacers at the side walls of the patterned mask layer;

using said patterned mask layer and said spacers as a mask, forming trenches in said substrate;

forming shallow trench isolation zones by filling said trenches with an oxide material;

etching the oxide material to partially remove the oxide material and to increase access to active areas in the substrate for an angularly-directed, non-orthogonal, ion implantation;

performing a first implant of ions from above the substrate to form the active areas in the substrate, using at least said patterned mask layer as a mask; and removing said patterned mask.

2. A method according to claim 1, furthermore comprising, before performing the first implant of ions, at least partially removing the spacers.

3. A method according to claim 1, wherein spacers are formed by depositing the first layer and etching back said layer to form the spacers.

4. A method according to claim 3, wherein deposition of said first layer is performed by forming a TEOS oxide layer.

5. A method according to claim 1, wherein, the substrate lying in a plane, the first implant of ions is performed in a direction substantially perpendicular to the plane of the substrate.

6. A method according to claim 1, wherein, the substrate lying in a plane, the first implant of ions is performed in a direction making an angle $\alpha$ with a direction substantially perpendicular to the plane of the substrate.

7. A method according to claim 1, wherein said first implant of ions is performed by implanting ions with a dose of between $1\times10^{12}$ and $1\times10^{14}$ cm$^{-3}$ and an energy of between 10 and 50 keV.

8. A method according to claim 1, furthermore comprising performing a second implant step.

9. A method according to claim 1, wherein said spacers are partially removed by performing an etching process.

10. A method according to claim 1, wherein the step of forming the patterned mask layer and the first layer includes forming a first insulating layer on the substrate, depositing a nitride layer on the first insulating layer and patterning the nitride layer to form the patterned mask layer, and wherein the step of forming the spacers includes depositing a second insulating layer on the patterned mask layer and on the substrate and etching the second insulating layer to form the spacers.

11. A method according to claim 1, wherein the patterned mask layer and the spacers are formed from different types of material and the material of the spacers is selectively etched with respect to the material of the patterned mask layer.

12. A method according to claim 1, wherein the active areas are formed in the substrate beneath the spacers.

13. A method of forming isolation zones in the manufacturing process of an electronic device, the method comprising:

forming a patterned mask layer and a first layer on top of a substrate, said patterned mask layer having side walls;

forming spacers at the side walls of the patterned mask layer;

using said patterned mask layer and said spacers as a mask, forming trenches in said substrate;

forming shallow trench isolation zones by filling said trenches;

after forming the shallow trench isolation zones, performing a first implant of ions to form active areas in the substrate, using at least said patterned mask layer as a mask;

removing said patterned mask; and wherein the step of forming the shallow trench isolation zones includes performing liner oxidation to grow a layer of oxide in each of the trenches, depositing an oxide layer that fills each of the trenches and covers the patterned mask layer and the spacers, performing densification of the oxide layer, planarizing the oxide layer to at least a surface of the patterned mask layer, and etching the oxide layer and the spacers to partially remove the oxide layer and to at least partially remove the spacers.

14. A method according to claim 13, wherein the steps of liner oxidation and densification are performed at a temperature between 1000° C. and 1200° C.

15. A method according to claim 1, wherein the step of etching the oxide material includes partially removing the oxide material and the spacers to expose a majority of the sidewalls of the patterned mask layer.

16. A method according to claim 13, wherein the step of etching the oxide material and the spacers includes partially removing the oxide material and the spacers to expose a majority of the sidewalls of the patterned mask layer.

* * * * *